(12) United States Patent
Krvavac

(10) Patent No.: US 6,731,174 B2
(45) Date of Patent: May 4, 2004

(54) RADIO FREQUENCY POWER AMPLIFIER DEVICE

(75) Inventor: Enver Krvavac, Lake Zurich, IL (US)

(73) Assignee: Motorola, Inc., Schaumburg, IL (US)

( * ) Notice: Subject to any disclaimer, the term of this patent is extended or adjusted under 35 U.S.C. 154(b) by 19 days.

(21) Appl. No.: 10/242,478

(22) Filed: Sep. 12, 2002

(65) Prior Publication Data

US 2004/0051588 A1 Mar. 18, 2004

(51) Int. Cl.[7] .............................................. H03F 3/04
(52) U.S. Cl. .................... 330/302; 330/330; 330/307; 333/32
(58) Field of Search ................. 330/302, 292, 330/303, 306, 307, 277, 286; 333/32, 33

(56) References Cited

U.S. PATENT DOCUMENTS

| | | | |
|---|---|---|---|
| 4,213,141 A | | 7/1980 | Colussi |
| 4,617,524 A | * | 10/1986 | Beckenbach et al. ....... 330/307 |
| 5,257,411 A | | 10/1993 | Minasi |
| 5,406,224 A | * | 4/1995 | Mikami et al. ............. 330/277 |
| 6,104,259 A | * | 8/2000 | Miyaura ..................... 333/176 |

* cited by examiner

Primary Examiner—Henry Choe
(74) Attorney, Agent, or Firm—Steven A. May

(57) ABSTRACT

A radio frequency (RF) power amplifier device that includes an RF amplification element coupled to an output matching circuit further includes a match extender that provides an extension of the output matching circuit beyond the RF power amplifier device. The match extender provides an apparatus by which the circuitry of the output matching circuit may be extended outside of the RF power amplifier device and by which output matching circuitry external to the RF power amplifier device may provide a matching impedance that originates at a die plane of the RF amplification element.

12 Claims, 3 Drawing Sheets

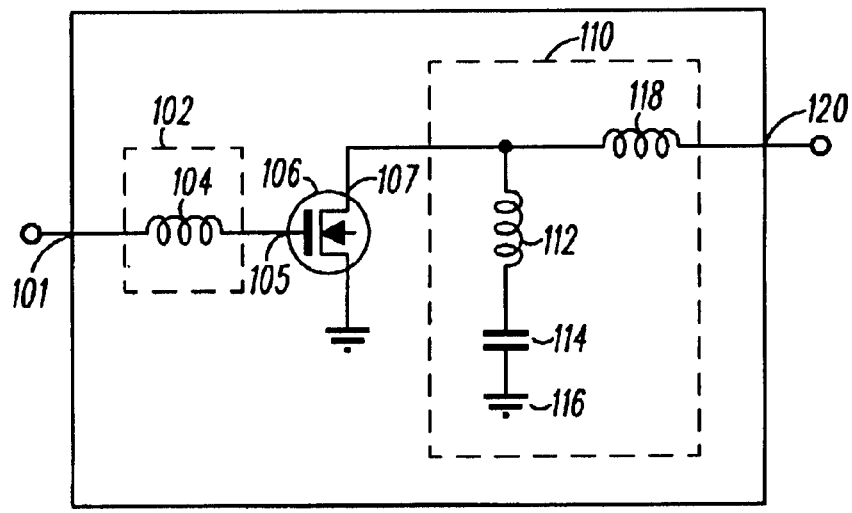
100
—PRIOR ART— *FIG. 1*
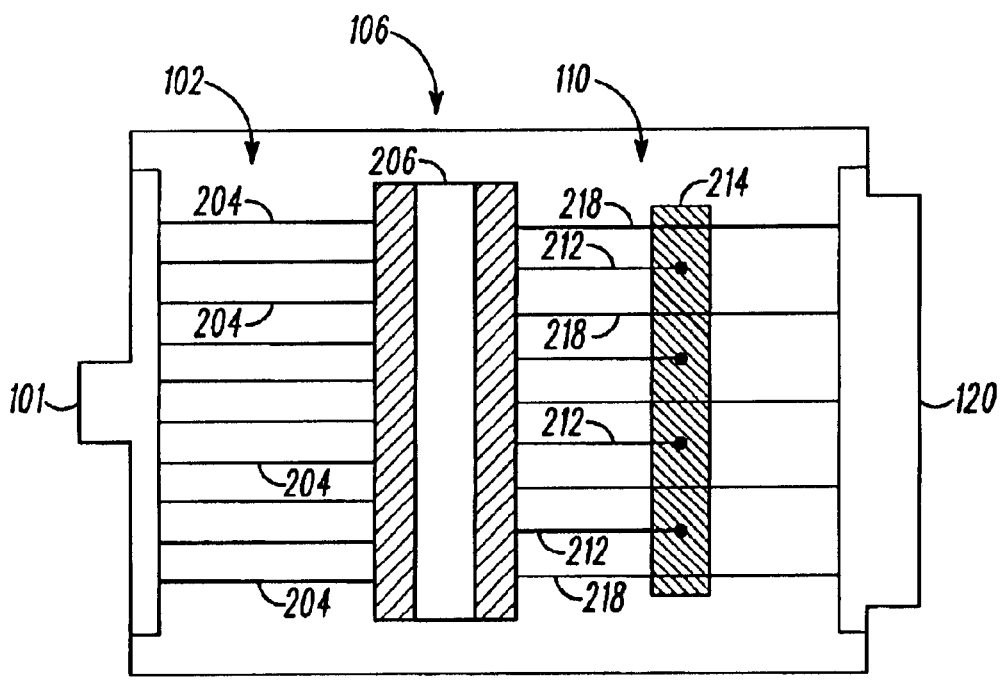
200
—PRIOR ART— *FIG. 2*

RADIO FREQUENCY POWER AMPLIFIER DEVICE

FIELD OF THE INVENTION

The present invention relates generally to radio frequency power amplifiers and in particular to a radio frequency power amplifier device for use in a radio frequency power amplifier.

BACKGROUND OF THE INVENTION

Radio frequency (RF) power amplifier devices for use in wireless transmission applications, such as RF power amplifiers, are typically implemented in an integrated circuit. The integrated circuit includes an RF amplification element, typically an RF transistor such as a Laterally Diffused Metal Oxide Semiconductor (LDMOS), that amplifies an RF signal applied to the device. When an RF power amplifier device is utilized in an RF power amplifier, the RF power amplifier typically further includes an input matching circuit coupled to an input of the RF power amplifier device and an output matching circuit coupled to an output of the RF power amplifier device. The input and output matching circuits are designed to optimize the performance of the RF amplification element included in the RF power amplifier device.

RF transistors such as LDMOS have very low output impedances, making it difficult to design an output matching circuit that will optimize performance of the transistor. In order to facilitate use of such a transistor in an RF power amplifier, RF power amplifier device manufacturers typically incorporate an output matching circuit into the integrated circuit that includes the RF transistor. The output matching circuit is designed to move the output impedance of RF transistor to a different, higher, and more easily matched output impedance at the output of the RF power amplifier device.

Referring now to FIGS. 1 and 2, an exemplary RF power amplifier device of the prior art is illustrated. FIG. 1 is a schematic diagram of RF power amplifier device 100. Typically, RF power amplifier device 100 is implemented in an integrated circuit 200, which integrated circuit is illustrated in FIG. 2. RF power amplifier device 100 includes an RF transistor 106, such as an LDMOS transistor or a Bipolar Junction Transistor (BJT), that amplifies an RF signal applied to the RF power amplifier device. Typically RF transistor 106 is an RF transistor die 206 that is embedded in the integrated circuit. RF power amplifier device 100 further includes an input 101 and an output 120, an input matching circuit 102 coupled between input 101 and an input 105 of RF transistor 106, and an output matching circuit 110 coupled between an output 107 of RF transistor 106 and output 120. Input matching circuit 102 typically comprises an input inductive element 104, such as multiple series input bond wires 202. Each bond wire of the multiple bond wires 202 is coupled to a gate, in the case of an LDMOS transistor, or a base, in the case of a BJT, of RF transistor 106.

Output matching circuit 110 comprises a shunt inductive element 112 and a series inductive element 118 that are each coupled to an output of RF transistor 106. Shunt inductive element 112 typically comprises multiple shunt bond wires 212 that are each coupled to an output of RF transistor die 206, typically a drain of an LDMOS transistor or a collector of a BJT. Series inductive element 118 typically comprises multiple series bond wires 218 that also are each coupled to the output of RF transistor die 206. Ideally, shunt bond wires 212 and series bond wires 218 are coupled to RF transistor die 206 at the die plane in order to minimize any additional, undesired inductances that may result from moving them away from the die plane. Output matching circuit 110 further includes a shunt capacitor 114, such as a metal oxide semiconductor capacitor (MOSCAP) 214, coupled between shunt inductive element 112, that is, shunt bond wires 212, and ground 116. Capacitive element 114 performs a direct current (DC) blocking function and further contributes to the output match provided by output matching circuit 110.

As is well known in the art, an impedance of output circuit 110, and in particular a value of each of elements 112, 114, and 118, presented to RF transistor 106 by each of shunt bond wires 212, capacitor 214, and series bond wires 218, varies with a frequency of the RF signal applied to RF amplifier device 100. As a result, output matching circuit 110 provides an effective output match to RF transistor 106 only over a very limited bandwidth. Since any additional output matching circuitry must be coupled to output 120 of RF power amplifier device 100, the shunt impedances 112, 114 of output matching circuit 110 are isolated from external matching circuitry. In addition, since each bond wire of the multiple shunt bond wires 212 is limited in overall length by a package encasing RF power amplifier device 100, the use of output matching circuit 110, and RF, power amplifier device 100, is limited to high frequency applications, such as frequencies of 2 gigahertz (GHz) and above. As a result, RF power devices that include internal matching circuitry are typically narrow band devices that are limited to high frequency applications.

Therefore, there is a need for an RF amplifier device that can be used across a wide band of frequencies and that can be designed into low frequency, as well as high frequency, applications.

BRIEF DESCRIPTION OF THE DRAWINGS

FIG. 1 is a schematic diagram of a radio frequency power amplifier device of the prior art.

FIG. 2 is a top view of an integrated circuit included in the RF power amplifier device of FIG. 1.

DETAILED DESCRIPTION OF THE INVENTION

To address the need for an RF amplifier device that can be used across a wide band of frequencies and that can be designed into low frequency, as well as high frequency, applications, a radio frequency (RF) power amplifier device that includes an RF amplification element coupled to an output matching circuit further includes a match extender that provides an extension of the output matching circuit beyond the RF power amplifier device. The match extender provides an apparatus by which the circuitry of the output matching circuit may be extended outside of the RF power amplifier device and by which output matching circuitry external to the RF power amplifier device may provide a matching impedance that originates at a die plane of the RF amplification element.

Generally, one embodiment of the present invention encompasses an RF power amplifier device that includes an RF device input, an RF device output, and an RF amplification element for amplifying an RF signal applied to the RF device input, wherein the RF amplification element includes an RF amplification element input and an RF amplification element output. The RF power amplifier device further includes an output matching circuit coupled to the RF amplification element output that presents an output impedance to the Rr, amplification element and a match extender that is not coupled to the RF device output and that provides an extension of the output matching circuit beyond the RF power amplifier device.

Another embodiment of the present invention encompasses an apparatus for amplifying a radio frequency (RF) signal. The apparatus includes an RF power amplifier device comprising an RF amplification element for amplifying the RF signal, wherein the RF amplification element includes an input and an output, an output matching circuit coupled to the output of the RF amplification element that includes a first shunt impedance, and a match extender coupled to the first shunt impedance. The apparatus further includes a second shunt impedance coupled in series with the first shunt impedance via the match extender.

Figure 3:
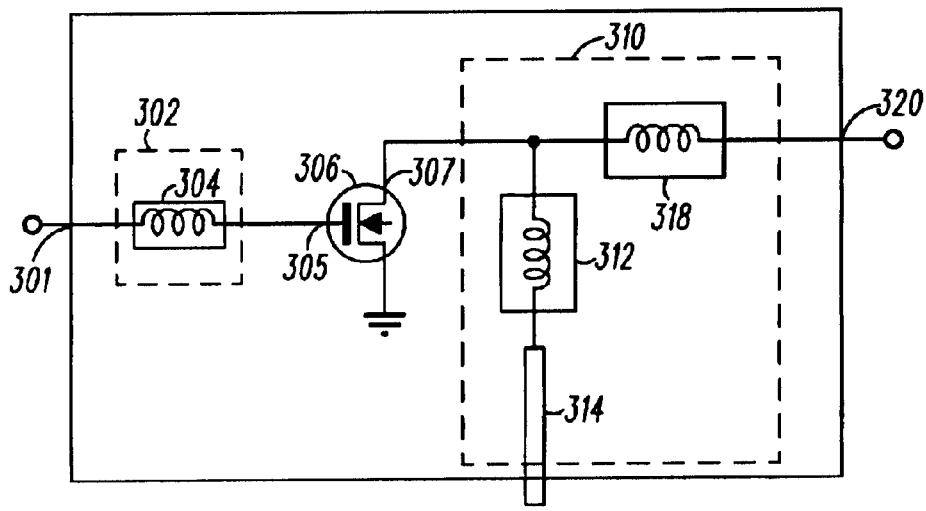
FIG. 3 is a schematic diagram of a radio frequency power amplifier device in accordance with an embodiment of the present invention.
Figure 4:
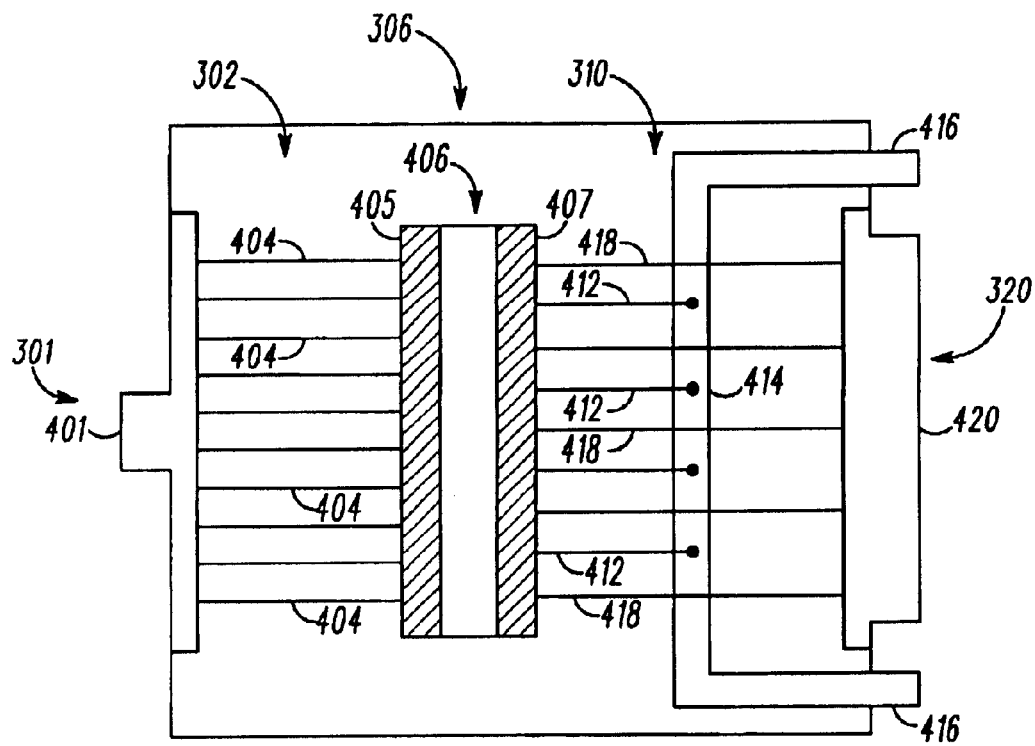
FIG. 4 is a top view of an integrated circuit included in the RF power amplifier device of FIG. 3 in accordance with an embodiment of the present invention.

Referring now to FIGS. 3 and 4, an exemplary RF power amplifier device 300 that is capable of being designed into multiple RF bandwidths of operation and is further capable of being designed into high and low frequency applications is illustrated. FIG. 3 is a schematic diagram of RF power amplifier device 300. The RF portions of RF power amplifier device 300 are implemented in an integrated circuit 400, which integrated circuit is illustrated in FIG. 4. In addition, RF power amplifier device 300 preferably is enclosed in an RF device package (not shown), which device package provides protection for the integrated circuit from environmental conditions external to the package that can impair the performance of the device and/or damage the device.

RF power amplifier device 300 includes an RF amplification element 306 that amplifies an RF signal applied to the RF power amplifier device. RF amplification element 306 comprises an RF power transistor, such as a Field Effect Transistor (FET), preferably a Laterally Diffused Metal Oxide Semiconductor (LDMOS) transistor, or a Bipolar Junction Transistor (BJT), that is implemented in the integrated circuit. For example, RF amplification element 306 may be a transistor die 406 embedded in the integrated circuit. The embedding of transistor die in an integrated circuit is well known in the art and will not be described in detail herein. Furthermore, those who are of ordinary skill in the art realize that any RF amplification element for which an output matching circuit is incorporated into a corresponding RF power amplifier device may be used herein without departing from the spirit and scope of the present invention.

RF power amplifier device 300 further includes an RF input 301 and an RF output 320, an input matching circuit 302 coupled between RF input 301 and an input 305 of RF amplification element 306, and an output matching circuit 310 coupled between RF output 320 and an output 307 of the RF amplification element. Input matching circuit 302 presents a matching impedance to input 305 of RF amplification element 306. Input matching circuit 302 includes a series impedance element 304, preferably an inductive element that comprises multiple series input bond wires 404. Each bond wire of the multiple bond wires 404 is coupled to an input 405 of transistor die 406, such as a gate of a FET or a base of a BJT, and a lead 401 corresponding to RF input 301. However, those who are of ordinary skill in the art realize that other configurations of RF amplification element 306 may be used in RF power amplifier device 300, such as a common base configuration with respect to a BJT or a common gate configuration with respect to an FET, without departing from the spirit and scope of the present invention.

Output matching circuit 310 presents a matching impedance to output 307 of RF amplification element 306. Preferably, output matching circuit 310 includes a shunt impedance element 312 and a series impedance element 318 that are each coupled to output 307 of RF amplification element 306. Series impedance element 318 preferably presents a series inductance to RF amplification element 306 and comprises multiple series bond wires 418 that are each coupled to an output 407 of transistor die 406, such as a drain of an LDMOS transistor or a collector of a BJT, and to a lead 420 corresponding to RF output 320. Shunt impedance element 312 preferably presents a shunt inductance to RF amplification element 306 and comprises multiple shunt bond wires 412 that are also each coupled to output 407 of transistor die 406. Ideally, each bond wire of the multiple shunt bond wires 412 and series bond wires 418 is coupled to transistor die 406 at the die plane.

In order to facilitate a utilization of RF power amplifier device 300 in each of multiple bandwidths of operation and in low frequency applications, output matching circuit 310 further comprises, or is coupled to, a match extender 314. Preferably, match extender 314 is serially coupled to shunt impedance element 312 and provides a signal propagation path for a signal propagating through shunt impedance element 312 to an impedance element external to RF power amplifier device 300. Preferably, match extender 314 comprises a signal propagation component 414, such as a wire, a transmission line, or a metal bar, capable of conducting an RF signal. Typically, such a signal propagation element has an inductive impedance component. Match extender 314 is coupled to each of the multiple shunt bond wires 412 at a distal end of the bond wire relative to transistor die 406. Match extender 314 further comprises at least one metallic lead 416 that extends beyond the integrated circuit implementing RF power amplifier device 300, preferably extending outside of the package enclosing RF power amplifier device 300, that is separate from RF output lead 420, and that provides for a coupling of an impedance element external to RF power amplifier device 300 to output matching circuit 310. Preferably match extender 314 comprises multiple leads (two shown) so as to minimize any differential in distance from any of the shunt bond wires 412 to any impedance elements that are external to RF power amplifier device 300 and that are coupled to the match extender.

Match extender 314 provides an apparatus by which the circuitry of output matching circuit 310 may be extended outside of RF power amplifier device 300. In the same way, match extender 314 provides an apparatus by which output matching circuitry external to RF power amplifier device 300 may provide a matching impedance that originates at the die plane of RF amplification element 306, 406. By permitting elements of an output matching impedance to be externally coupled to RF power amplifier device 300 and, at the same time, permitting these elements to be part of an impedance that originates at the die plane, RF power amplifier device 300 provides a wideband, frequency adjustable device with internal matching circuitry that is not restricted to the narrow band, high frequency applications of the prior art.

Figure 5:
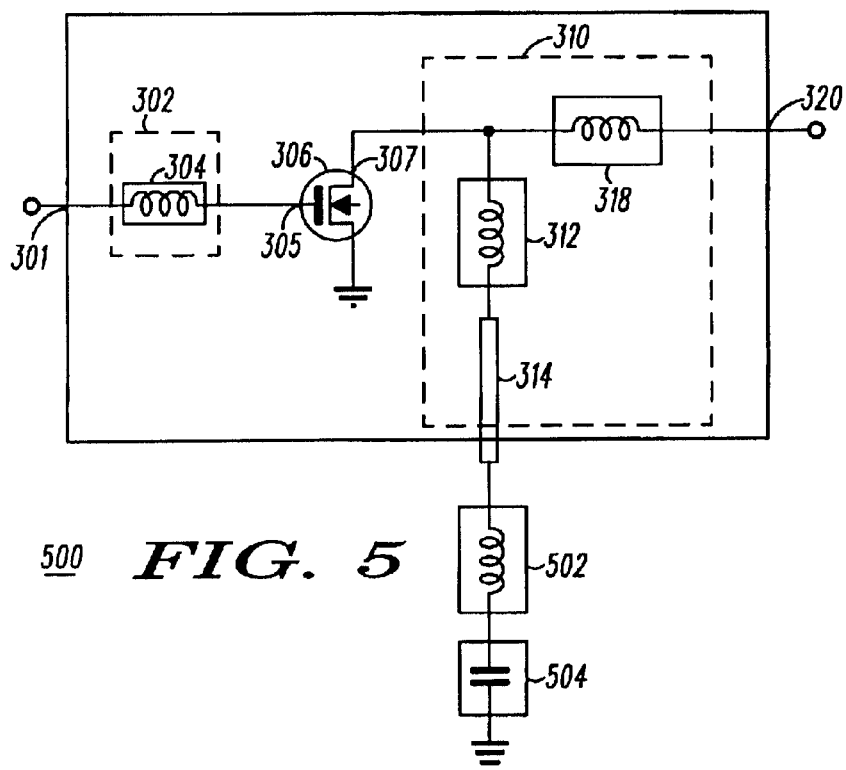
FIG. 5 is a schematic diagram of an apparatus for amplifying a radio frequency signal in accordance with another embodiment of the present invention.

For example, FIG. 5 is a schematic diagram of an apparatus 500 for amplifying an RF signal in accordance with another embodiment of the present invention. One application of apparatus 500 is a low frequency application, wherein the frequency of an RF signal applied to RF power amplifier device 300 is sufficiently low that the shunt bond wires 412 of RF power amplifier device 300 are of insufficient length to provide an optimal matching impedance for RF amplification element 306.

Apparatus 500 includes an impedance element 502 that is coupled external to RF power amplifier device 300. Impedance element 502, preferably an inductive element such as a transmission line, is coupled to each of the leads 416 of match extender 314, and thereby is serially coupled to shunt impedance element 312. Collectively, impedance elements 312 and 502, in conjunction with match extender 314, provide an output shunt impedance to RF power amplifier device 300 that originates at the die plane of RF amplification element 306 and that optimizes the device's performance. In addition, a shunt capacitive element 504, such as a capacitor, may be coupled between external impedance element 502 and ground 506. Capacitive element 504 may perform a direct current (DC) blocking function and may further contribute to the collective shunt impedance presented to RF amplification element 306 by elements 312, 314, and 502. By permitting elements 502 and 504 to be externally coupled to RF power device 300 and, at the same time, permitting elements 502 and 504 to be part of an impedance that originates that the die plane, RF power amplifier device 300 includes an output matching circuit with a collective shunt inductive element of sufficient length that the collective shunt inductive element is capable of providing a low frequency output match to RF amplification element 306.

Figure 6:
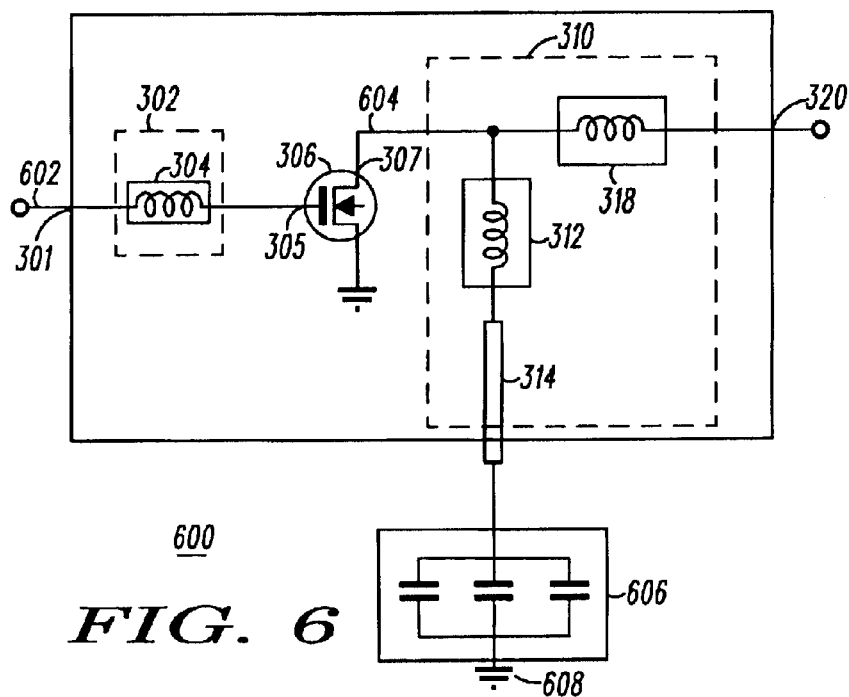
FIG. 6 is a schematic diagram of an apparatus for amplifying a radio frequency signal in accordance with another embodiment of the present invention.

By way of another example, FIG. 6 is a schematic diagram of an apparatus 600 for amplifying an RF signal in accordance with yet another embodiment of the present invention. One application of apparatus 600 is an amplification of a wide bandwidth, multi-carrier signal, such as an RF signal 602 that comprises at least two RF carriers, $f_1$ and $f_2$. A mixing of a first carrier, $f_1$, and a second carrier, $f_2$, of the at least two carriers produces multiple modulation frequency components that build up on the input 305 and the output 307 of RF amplification element 306. When RF amplification element 306 amplifies the multi-carrier RF signal applied to RF amplifying device 300 to produce an amplified signal 604, the modulation frequency components of the amplified signal can negatively impact a linearity of the resulting amplified signal. Therefore, the modulation frequency components need to be filtered or suppressed.

A typical method of the prior art for filtering the modulation frequency components from the amplified signal is to couple shorting capacitors at output 320 of RF power amplifier device 300. Typically, a shunt inductor that functions as an RF choke is coupled to output 320, and thereby to series impedance 318. Multiple, parallel shorting capacitors are then coupled in series with the RF choke and are further coupled to ground. The RF choke blocks RF carrier components of the amplified signal from being coupled to any of the shorting capacitors. Meanwhile, each shorting capacitor of the multiple, parallel shorting capacitors provides a short to ground for a modulation frequency component of the multiple modulation frequency components, thereby removing the modulation frequency component from the amplified signal.

A problem with the prior art method for filtering the modulation frequency components is that the modulation frequency component propagation path from the die plane of RF amplification element 306 to the shorting capacitors includes a significant inductive component, including the RF choke, series impedance 318, and the lead corresponding to output 320. In multi-carrier operations wherein the modulation frequencies may be as high as 30 megahertz (MHz), the inductive component of the modulation frequency component propagation path can cause the shorting capacitors to no longer appear as shorts at the frequencies of the modulation frequency components.

In order to minimize the inductance of the propagation path of the modulation frequency components from the die plane to the shorting capacitors, apparatus 600 provides a shorting capacitance 606 coupled to RF power amplifier device 300 via match extender 314, thereby serially coupling the shorting capacitance 606 with shunt impedance element 312. Preferably, shorting capacitance 606 comprises one or more sets of one or more capacitive elements, such as capacitors. The number of sets of capacitive elements corresponds to the number of leads 416 of match extender 314, and each set of capacitive elements is coupled to a corresponding match extender lead. The one or more capacitive elements in each set of capacitive elements are connected in parallel. Each capacitive element of the one or more capacitive elements in each set of capacitive elements appears as a short to ground to a modulation frequency component of the multiple modulation frequency components. By coupling a set of capacitive elements to each lead 416 of match extender 314, a shorted modulation frequency component is presented with an approximately similar propagation path to ground via each lead of the one or more leads 416. Furthermore, by coupling each set of capacitive elements to a lead 416 of match extender 314, the inductance of the propagation path of the modulation frequency components from the die plane of RF amplification element 306 to the shorting capacitors is reduced in comparison to prior art designs, thereby enhancing the performance of the shorting capacitive elements.

In sum, an RF power amplifier device is provided that can be used across a wide band of frequencies and that can be designed into low frequency, as well as high frequency, applications. The RF power amplifier device includes an RF amplification element coupled to an output matching circuit and further includes a match extender that provides an extension of the output matching circuit beyond the RF power amplifier device. The match extender provides an apparatus by which the circuitry of the output matching circuit may be extended outside of the RF power amplifier device, thereby expanding, relative to the prior art, a range of frequencies over which the output matching circuit may provide an optimal output match for the RF amplification element. Furthermore, the match extender provides an apparatus by which output matching circuitry external to the RF power amplifier device may provide a matching impedance that originates at a die plane of the RF amplification element, thereby minimizing undesirable intervening inductive impedances that reduce the effectiveness of the output matching circuitry.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A radio frequency (RF) power amplifier device comprising:
   an RF device input;
   an RF device output;
   an RF amplication element for amplifying an RF signal applied to the RF device input, wherein the RF amplification element comprises an RF amplification element input and an RF amplification element output;
   an output matching circuit coupled to the RF amplification element output that presents an output impedance to the RF amplification element; and
   a match extender that is coupled to the RF amplification element output and is not coupled to the RF device output and that provides an extension of the output matching circuit beyond the RF power amplifier device, wherein the match extender comprises a plurality of leads, wherein each lead of the plurality of leads provides for a coupling, to the output matching circuit, of an impedance external to the RF power amplifier device.

2. The radio frequency power amplifier device of claim 1, wherein the output matching circuit comprises the match extender.

3. The radio frequency power amplifier device of claim 1, wherein the output matching circuit is coupled to the match extender.

4. The radio frequency power amplifier device of claim 1, wherein the match extender comprises a signal propagation component capable of conducting an RF signal.

5. A radio frequency RF power amplifier device comprising:
   an RF device input;
   an RF device output;
   an RF amplification element for amplifying an RF signal applied to the RF device input, wherein the RF amplification element comprises an RF amplification element input and an RF amplification element output;
   an output matching circuit coupled to the RF amplification element output, wherein the output matching circuit comprises a shunt impedance that comprises a plurality of bond wires; and
   a match extender that is coupled to the RF amplification element output via the shunt impedance and that is not coupled to the RF device output, wherein the match extender comprises a signal propagation component coupled to each bond wire of the plurality of bond wires and provides an extension of the output matching circuit beyond the RF power amplifier device.

6. The radio frequency power amplifier device of claim 5, wherein the match extender comprises at least one of a wire, a transmission line, and a metal bar.

7. The radio frequency power amplifier device of claim 5, wherein the match extender comprises a plurality of leads for a coupling of an impedance external to the RF power amplifier device to the match extender.

8. An apparatus for amplifying a radio frequency (RF) signal, the apparatus comprising:
   an RF power amplifier device comprising:
      an RF amplification element for amplifying the RF signal, wherein the RF amplification element comprises an input and an output;
      an output matching circuit coupled to the output of the RF amplification element and having a first shunt impedance that comprises a plurality of bond wires;
      a match extender comprising a signal propagation component that is coupled to each bond wire of the plurality of bond wires; and
   a second shunt impedance coupled in series with the first shunt impedance via the match extender.

9. The apparatus of claim 8, wherein the first shunt impedance is an inductive impedance, wherein the second shunt impedance is an inductive impedance, and wherein the coupling of the second shunt impedance to the first shunt impedance produces a third shunt impedance that provides a lower frequency impedance match to the RF amplification element than is provided by the first shunt impedance in an absence of the second shunt impedance.

10. The apparatus of claim 8, wherein the radio frequency signal comprises a modulation frequency component and wherein the second shunt impedance comprises a capacitive impedance for shorting the modulation frequency component to ground.

11. The apparatus of claim 8, wherein the match extender comprises at least one of a wire, a transmission line, and a metal bar.

12. The apparatus of claim 8, wherein the match extender comprises at least one lead and wherein the second shunt impedance is coupled to the at least one lead of the match extender.

* * * * *